(12) United States Patent
Park

(10) Patent No.: US 11,839,130 B2
(45) Date of Patent: Dec. 5, 2023

(54) ORGANIC LIGHT EMITTING DIODE DISPLAY DEVICE HAVING LIGHT CONTROLLING ELEMENT

(71) Applicant: LG DISPLAY CO., LTD., Seoul (KR)

(72) Inventor: Sun-Young Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 141 days.

(21) Appl. No.: 17/017,041

(22) Filed: Sep. 10, 2020

(65) Prior Publication Data
US 2021/0074779 A1 Mar. 11, 2021

(30) Foreign Application Priority Data

Sep. 11, 2019 (KR) .......................... 10-2019-0112653

(51) Int. Cl.
| | | |
|---|---|---|
| H10K 59/50 | (2023.01) | |
| G02F 1/1334 | (2006.01) | |
| G02F 1/155 | (2006.01) | |
| G02F 1/1343 | (2006.01) | |
| G02F 1/1337 | (2006.01) | |
| H10K 59/38 | (2023.01) | |
| H10K 59/126 | (2023.01) | |
| G09G 3/3266 | (2016.01) | |
| G09G 3/3275 | (2016.01) | |
| G09G 3/3233 | (2016.01) | |

(52) U.S. Cl.
CPC .......... *H10K 59/50* (2023.02); *G02F 1/1334* (2013.01); *G02F 1/1337* (2013.01); *G02F 1/1343* (2013.01); *G02F 1/155* (2013.01); *H10K 59/126* (2023.02); *H10K 59/38* (2023.02); *G02F 1/13345* (2021.01); *G09G 3/3233* (2013.01); *G09G 3/3266* (2013.01); *G09G 3/3275* (2013.01); *G09G 2300/0426* (2013.01); *G09G 2310/08* (2013.01)

(58) Field of Classification Search
CPC .......................... G02F 1/1334; G02F 1/13345
See application file for complete search history.

(56) References Cited

U.S. PATENT DOCUMENTS

| | | | | |
|---|---|---|---|---|
| 2010/0171419 A1* | 7/2010 | Kim | ..................... | H01L 51/5268 313/505 |
| 2015/0009436 A1* | 1/2015 | Kim | ..................... | G02F 1/13725 349/86 |
| 2017/0351141 A1* | 12/2017 | Kubota | ............. | G02F 1/133512 |

FOREIGN PATENT DOCUMENTS

KR 10-2015-0028128 A 3/2015

\* cited by examiner

*Primary Examiner* — Lauren Nguyen
(74) *Attorney, Agent, or Firm* — Morgan, Lewis & Bockius LLP

(57) ABSTRACT

An organic light emitting diode display device includes a substrate having a sub-pixel and a transparent region, a counter substrate facing into the substrate, and a light emitting diode and a light controlling element between the substrate and the counter substrate, the light controlling element transmitting or shielding a light. The light emitting diode overlaps the sub-pixel, and the light controlling element overlaps the transparent region.

19 Claims, 9 Drawing Sheets

ORGANIC LIGHT EMITTING DIODE DISPLAY DEVICE HAVING LIGHT CONTROLLING ELEMENT

CROSS REFERENCE TO RELATED APPLICATIONS

The present application claims the priority benefit of Korean Patent Application No. 10-2019-0112653 filed in the Republic of Korea on Sep. 11, 2019, which is hereby incorporated by reference in its entirety for all purposes as if fully set forth herein.

BACKGROUND

Technical Field

The present disclosure relates to an organic light emitting diode display device, and more particularly, to an organic light emitting diode display where a bright room contrast ratio is improved without increase of a thickness.

Discussion of the Related Art

As an information-oriented society progresses, demand for a display device displaying an image have increased with various forms. In a display device field, a cathode ray tube (CRT) having a relatively large volume has been rapidly replaced by a flat panel display (FPD) device having a thin profile, a light weight and applicable to a relatively large size. The FPD device includes a liquid crystal display (LCD) device, a plasma display panel (PDP) and an organic light emitting diode (OLED) display device and an electrophoretic display (ED) device.

Among FPD devices, the OLED display device is an emissive device and has advantages such as a high response speed, a high luminance and a wide viewing angle. Specifically, the OLED display device may be formed on a flexible substrate. In addition, the OLED display device may be driven with a relatively low voltage and may have advantages such as a small power consumption and an excellent color sensitivity as compared with the PDP or an inorganic electroluminescent (EL) display.

Recently, a transparent display device through which a user at a front portion may watch a rear portion has been developed. For example, a transparent OLED display device may include a sub-pixel emitting a light and a transmissive region through which an external light passes. Since a light of a rear portion passes through the transparent display device, the transparent display device may have a relatively low bright room contrast ratio. Accordingly, the transparent display device having an improved bright room contrast ratio has been researched.

SUMMARY

Accordingly, embodiments of the present disclosure is directed to an organic light emitting diode display device that substantially obviates one or more of the problems due to limitations and disadvantages of the related art.

An object of the present disclosure is to provide an organic light emitting diode display where a bright room contrast ratio of a transparent display device is improved without increase of a thickness.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the present disclosure, as embodied and broadly described herein, an organic light emitting diode display device includes: a substrate having a sub-pixel and a transparent region; a counter substrate facing into the substrate; and a light emitting diode and a light controlling element between the substrate and the counter substrate, the light controlling element transmitting or shielding a light, wherein the light emitting diode overlaps the sub-pixel, and wherein the light controlling element overlaps the transparent region.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
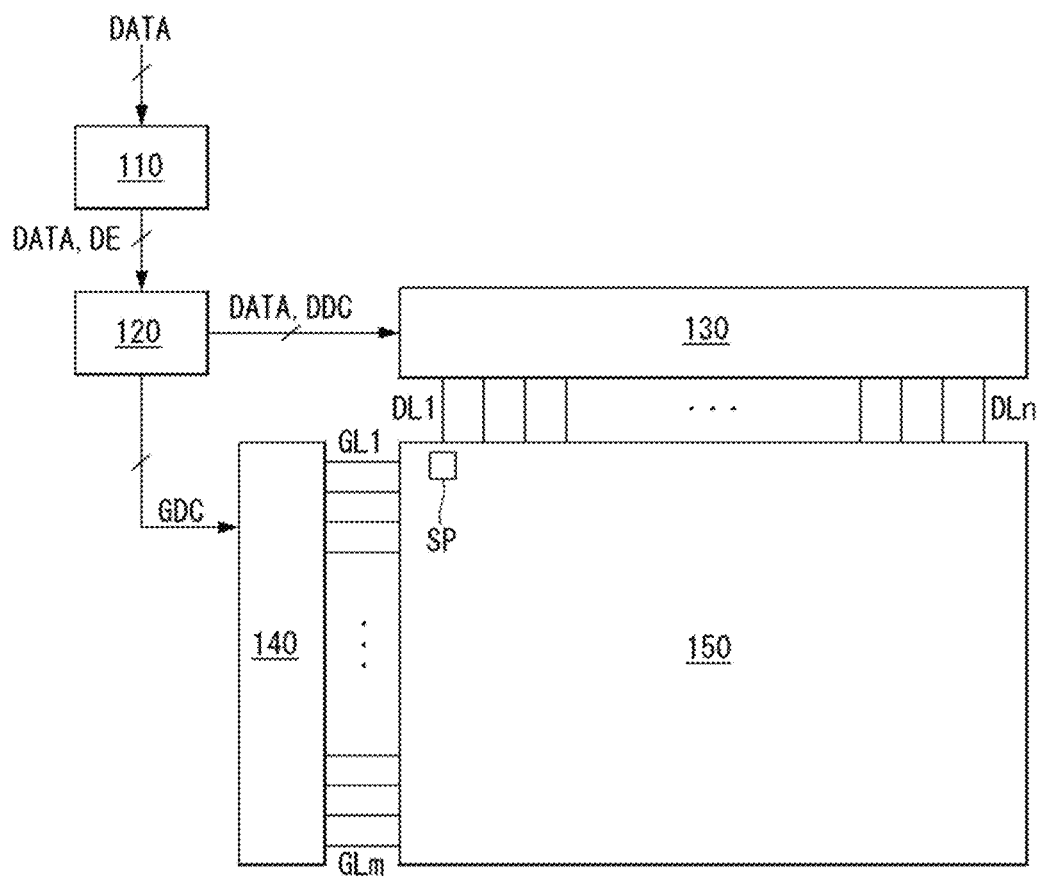
FIG. 1 is a view showing an organic light emitting diode display device according to a first embodiment of the present disclosure.

Reference will now be made in detail to aspects of the disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an organic light emitting diode display device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

A display device according to embodiments of the present disclosure includes a display element on a glass substrate or a flexible substrate. Although an organic light emitting diode (OLED) display device, a liquid crystal display (LCD) device and an electrophoretic display (ED) device may be used as a display device according to the present disclosure, an OLED display device will be exemplarily illustrated in the present disclosure. The OLED display device includes a first electrode of an anode, a second electrode of a cathode and a light emitting layer of an organic material between the first and second electrode. As a result, in the OLED display device of an emissive device, a hole supplied from the first electrode and an electron supplied from the second electrode are combined with each other in a light emitting layer to generate an exciton of a pair of hole-electron, and a light is emitted due to an energy generated when the exciton transitions from an excited state to a ground state.

A display device according to embodiments of the present disclosure includes an OLED display device having a top emission type. In the top emission type OLED display device, a light emitted from a light emitting layer passes through a transparent second electrode at an upper portion.

Figure 2:
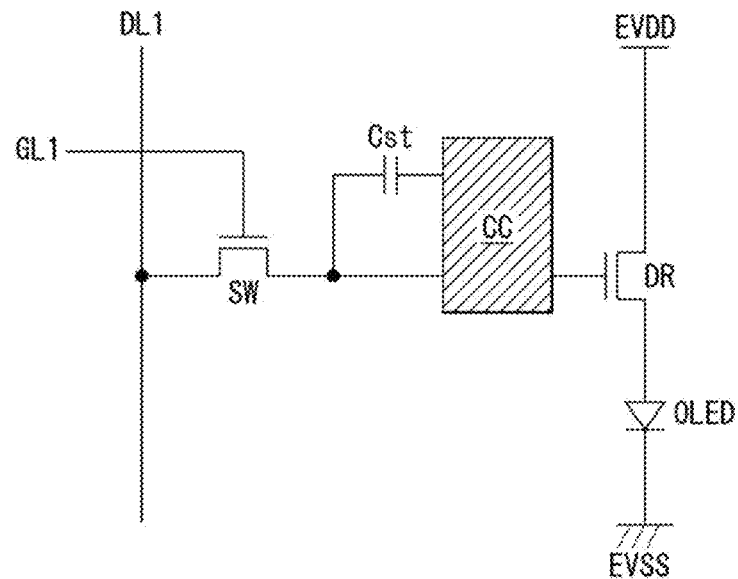
FIG. 2 is a view showing a sub-pixel of an organic light emitting diode display device according to a first embodiment of the present disclosure.
Figure 3:
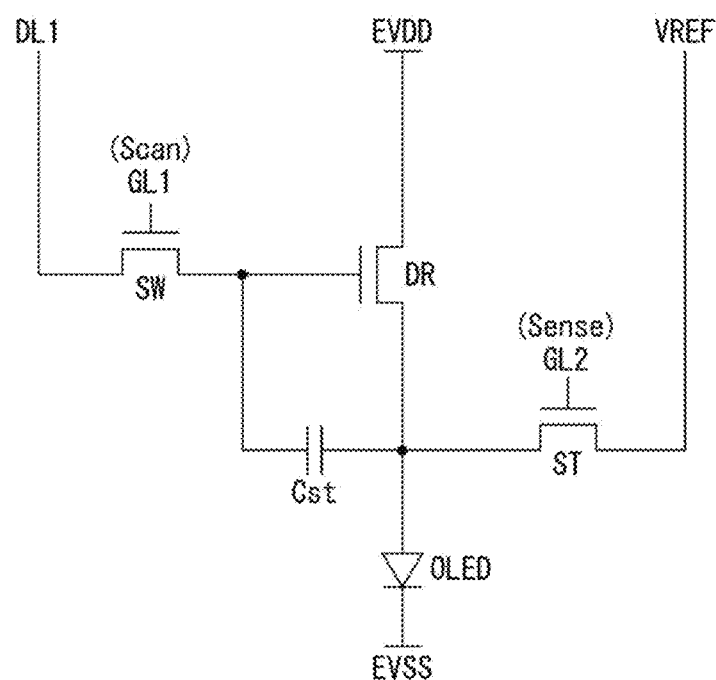
FIG. 3 is a view showing a detailed circuit of a sub-pixel of an organic light emitting diode display device according to a first embodiment of the present disclosure.

FIG. 1 is a view showing an organic light emitting diode display device according to a first embodiment of the present disclosure, FIG. 2 is a view showing a sub-pixel of an organic light emitting diode display device according to a first embodiment of the present disclosure, and FIG. 3 is a view showing a detailed circuit of a sub-pixel of an organic light emitting diode display device according to a first embodiment of the present disclosure.

In FIG. 1, an organic light emitting diode (OLED) display device includes an image processing part 110, a timing controlling part 120, a data driving part 130, a gate driving part 140 and a display panel 150.

The image processing part 110 outputs a data signal DATA supplied from an exterior and a data enable signal DE. Although the image processing part 110 may output at least one of a vertical synchronization signal, a horizontal synchronization signal and a clock signal as well as the data enable signal DE, the above signals are not shown for convenience of illustration.

The timing controlling part 120 receives a plurality of driving signals including the data enable signal DE, the vertical synchronization signal, the horizontal synchronization signal and the clock signal and the data signal DATA from the image processing part 110. The timing controlling part 120 outputs a gate control signal GDC for controlling a driving timing of the gate driving part 140 and a data control signal DDC for controlling a driving timing of the data driving part 130 based on the plurality of driving signals.

The data driving part 130 samples and latches the data signal DATA supplied from the timing controlling part 120 in response to the data control signal DDC supplied from the timing controlling part 120. The data driving part 130 converts the data signal DATA into a gamma reference voltage and outputs the gamma reference voltage. The data driving part 130 outputs the data signal DATA through a plurality of data lines DL1 to DLn. The data driving part 130 may be formed as an integrated circuit (IC).

The gate driving part 140 outputs a gate signal in response to the gate control signal GDC supplied from the timing controlling part 120. The gate driving part 140 outputs the gate signal through a plurality of gate lines GL1 to GLm. The gate driving part 140 may be formed as an integrated circuit (IC) or may be formed in the display panel 150 as a gate in panel (GIP).

The display panel 150 displays an image in response to the data signal DATA supplied from the data driving part 130 and the gate signal supplied from the gate driving part 140. The display panel 150 includes a plurality of sub-pixels SP driven to display the image.

The plurality of sub-pixels SP may include a red sub-pixel, a green sub-pixel and a blue sub-pixel or may include a white sub-pixel, a red sub-pixel, a green sub-pixel and a blue sub-pixel. The plurality of sub-pixels SP may have at least one different emitting area according to an emission property.

In FIG. 2, one sub-pixel includes a switching transistor SW, a driving transistor DR, a capacitor Cst, a compensating circuit CC and a light emitting diode OLED.

The switching transistor SW is turned on and off (switching) in response to the gate signal supplied from a first gate line GL1 such that the data signal supplied through a data line DL is stored as a data voltage in the capacitor Cst. The driving transistor DR is turned on and off according to the data voltage stored in the capacitor Cst such that a driving current flows between a first source line EVDD of a high level voltage and a second source line EVSS of a low level voltage. The light emitting diode OLED is driven to emit a light according to the driving current formed by the driving transistor DR.

The compensating circuit CC is added in the sub-pixel to compensate a threshold voltage of the driving transistor DR. The compensating circuit CC may include at least one transistor. The compensating circuit CC may have various structures according to an external compensating method. The compensating circuit CC will be exemplarily illustrated hereinafter.

In FIG. 3, the compensating circuit CC may include a sensing transistor ST and a sensing line VREF (or a reference line). The sensing transistor ST is connected between a source electrode of the driving transistor DR and an anode (hereinafter, a sensing node) of the light emitting diode OLED. The sensing transistor ST supplies an initializing voltage (or a sensing voltage) transmitted through the sensing line VREF to the sensing node of the driving transistor DR, or the sensing transistor ST senses a voltage or a current of the sensing node of the driving transistor DR or the sensing line VREF.

One of a source electrode and a drain electrode of the switching transistor SW is connected to the data line DL, and the other of the source electrode and the drain electrode of the switching transistor SW is connected to the gate electrode of the driving transistor DR. One of a source electrode and a drain electrode of the driving transistor DR is connected to the first source line EVDD, and the other of the source electrode and the drain electrode of the driving transistor DR is connected to the anode (first electrode) of the light emitting diode OLED. A first electrode of the capacitor Cst is connected to the gate electrode of the driving transistor DR, and a second electrode of the capacitor Cst is connected to the anode of the light emitting diode OLED. The anode of the light emitting diode OLED is connected to one of the source electrode and the drain electrode of the driving transistor DR, and a cathode (second electrode) of the light emitting diode OLED is connected to the second source line EVSS. One of a source electrode and a drain electrode of the sensing transistor ST is connected to the sensing line VREF, and the other of the source electrode and the drain electrode of the sensing transistor ST is connected to the anode of the light emitting diode OLED of the sensing node and the other of the source electrode and the drain electrode of the driving transistor DR.

An operation timing of the sensing transistor ST may be similar to or the same as that of the switching transistor SW according to an external compensating algorithm (or a structure of the compensating circuit). For example, the gate electrode of the switching transistor SW may be connected to the first gate line GL1, and the gate electrode of the sensing transistor ST may be connected to a second gate line GL2. In this case, the gate signal Scan may be transmitted to the first gate line GL1, and a sensing signal Sense may be transmitted to the second gate line GL2. In another embodiment, the first gate line GL1 connected to the gate electrode of the switching transistor SW and the second gate line GL2 connected to the gate electrode of the sensing transistor ST may be commonly connected to each other.

The sensing line VREF may be connected to the data driving part. In this case, the data driving part senses the sensing node of the sub-pixel in a real time or during a non-display period or during an Nth frame (N is an integer equal to or greater than 1) and generates a sensing result. The switching transistor SW and the sensing transistor ST may be turned on at the same time. In this case, a sensing operation through the sensing line VREF based on a time division method of the data driving part and a data outputting operation outputting the data signal are separated (divided) from each other.

A compensation object according to the sensing result may include the data signal of a digital type, the data signal of an analog type and the gamma. The compensating circuit generating a compensation signal (or a compensation voltage) based on the sensing result may be disposed inside the data driving part or the timing controlling part, or may be formed as an additional circuit.

Although the sub-pixel has a 3T1C (three transistors and one capacitor) structure including the switching transistor SW, the driving transistor DR, the capacitor Cst, the light emitting diode OLED and the sensing transistor ST in FIG. 3, the sub-pixel may have one of 3T2C, 4T2C, 5T1C and 6T2C structures including the compensating circuit CC in another embodiment.

Figure 4:
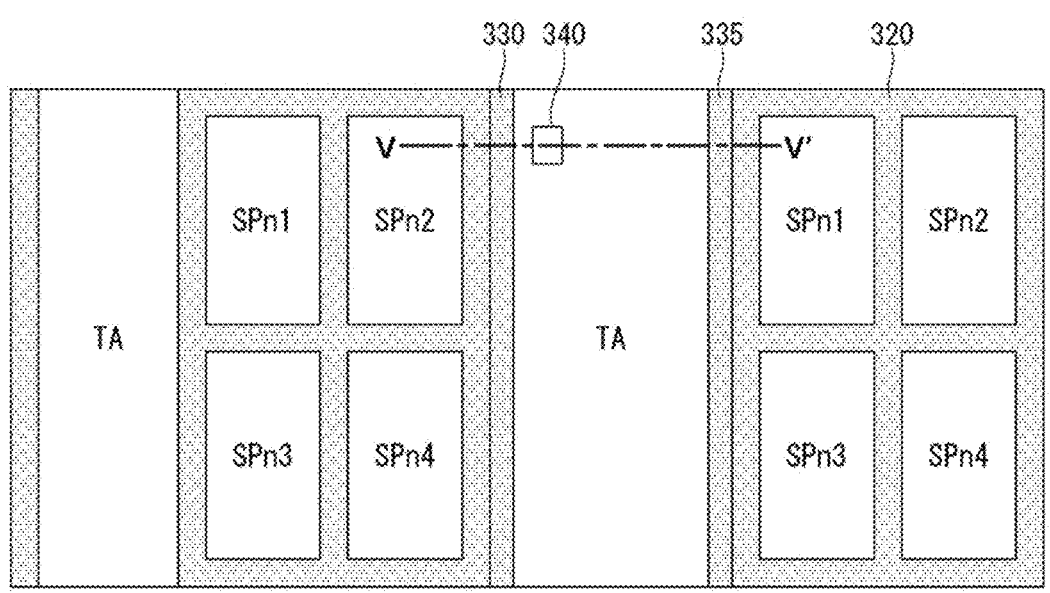
FIG. 4 is a plan view showing a sub-pixel and a transparent region of an organic light emitting diode display device according to a first embodiment of the present disclosure.
Figure 5:
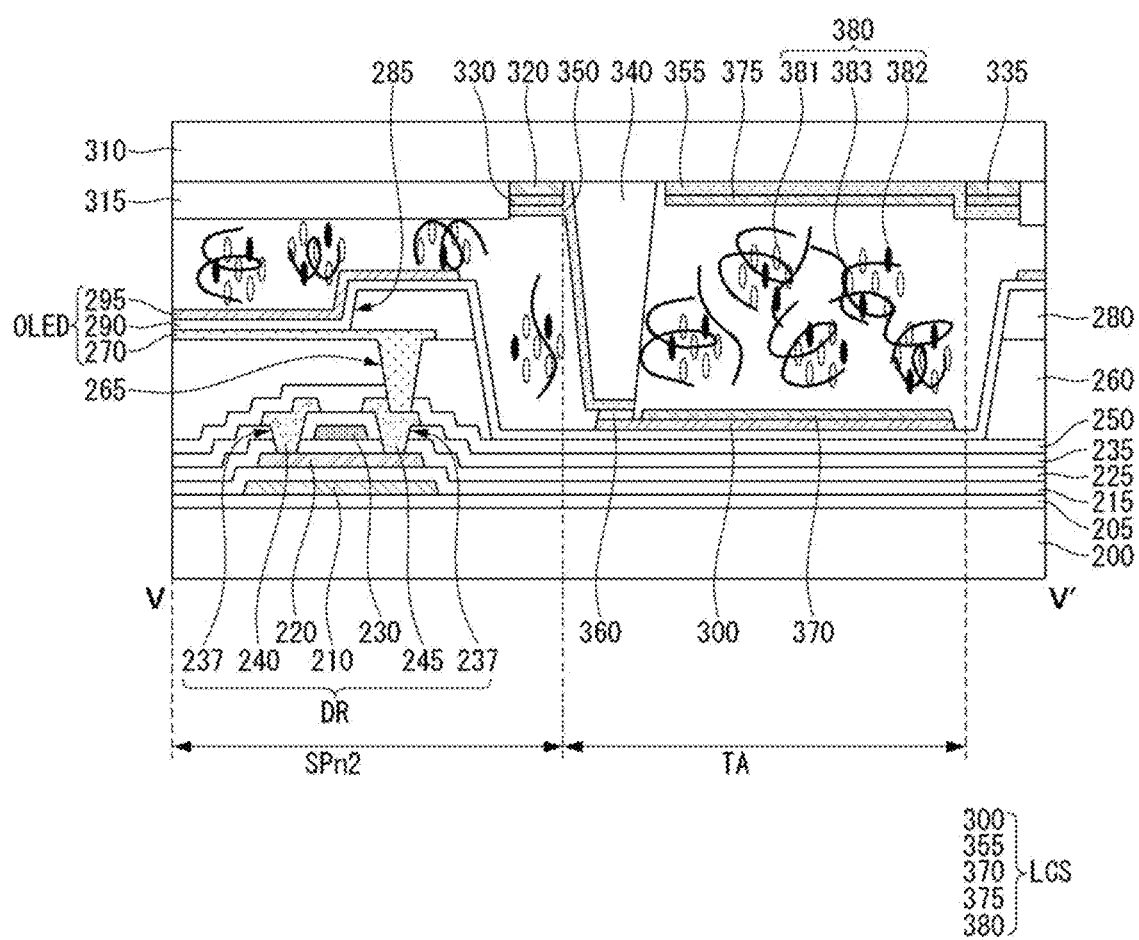
FIG. 5 is a cross-sectional view taken along a line V-V' of FIG. 4.

FIG. 4 is a plan view showing a sub-pixel and a transparent region of an organic light emitting diode display device according to a first embodiment of the present disclosure, and FIG. 5 is a cross-sectional view taken along a line V-V' of FIG. 4.

In FIG. 4, the OLED display device according to the first embodiment of the present disclosure is a transparent display device through which a user at a front portion may watch a rear portion. The transparent OLED display device includes first to fourth sub-pixels SPn1 to SPn4 emitting a light and a transparent region TA through which an external light passes.

The first to fourth sub-pixels SPn1 to SPn4 are disposed in a matrix of two rows and two columns and constitute one pixel. For example, the first and second sub-pixels SPn1 and SPn2 may be disposed at the first and second columns, respectively, of the first row, and the third and fourth sub-pixels SPn3 and SPn4 may be disposed at the first and second columns, respectively, of the second row. The first to fourth sub-pixels SPn1 to SPn4 may emit red, white, blue and green, respectively, to constitute one pixel. However, an arrangement of the first to fourth sub-pixels SPn1 to SPn4 may vary according to an emitting material, an emitting area and a structure of a compensating circuit. In addition, the sub-pixels of red, green and blue may constitute one pixel.

The transparent region TA is disposed at one side of the first to fourth sub-pixels SPn1 to SPn4. For example, the transparent region TA may be disposed at a left side of the first and third sub-pixels SPn1 and SPn3 and at a right side of the second and fourth sub-pixels SPn2 and SPn4.

In FIG. 5, the OLED display device according to the first embodiment of the present disclosure includes a substrate 200. The substrate 200 includes the second sub-pixel SPn2 and the transparent region TA. After the second sub-pixel SPn2 is illustrated, the transparent region TA is illustrated.

A first buffer layer 205 is disposed on the substrate 200 in the second sub-pixel SPn2. The substrate 200 may include one of a glass, a plastic and a metal. The first buffer layer 205 protects a thin film transistor (TFT) formed in a subsequent process from an impurity such as an alkali ion erupted from the substrate 200. The first buffer layer 205 may have a single layer including one of silicon oxide (SiOx) and silicon nitride (SiNx) or a multiple layer including at least one of silicon oxide (SiOx) and silicon nitride (SiNx).

A light shielding layer 210 is disposed on the first buffer layer 205 in the second sub-pixel SPn2. The light shielding layer 210 blocks an external light to prevent a photo current generated in the TFT. The light shielding layer 210 may include molybdenum titanium (MoTi) having an excellent light absorption rate and an excellent conductivity. A second buffer layer 215 is disposed on the light shielding layer 210 in the second sub-pixel SPn2. Similarly to the first buffer layer 205, the second buffer layer 215 may have a single layer including one of silicon oxide (SiOx) and silicon nitride (SiNx) or a multiple layer including at least one of silicon oxide (SiOx) and silicon nitride (SiNx).

A semiconductor layer 220 is disposed on the second buffer layer 215 in the second sub-pixel SPn2. The semiconductor layer 220 may include one of a silicon semiconductor material and an oxide semiconductor material. The silicon semiconductor material may include one of amorphous silicon and polycrystalline silicon. Since the polycrystalline silicon has a relatively high mobility (over 100 cm$^2$/Vs), a relatively low power consumption and an excellent reliability, the polycrystalline silicon may be applied to a driving element and/or a multiplexer (MUX) of a gate driver or a driving TFT in a pixel. Since the oxide semiconductor material has a relatively low off-current, the oxide semiconductor material may be applied to a switching TFT for keeping an On time short and keeping an Off time long. In addition, since the oxide semiconductor material has a relatively low off-current and a relatively long duration of a pixel voltage, the oxide semiconductor material may be applied to a display device of a low speed driving and/or a low power consumption. The semiconductor layer 220 includes a drain region and a source region having an impurity of a p (positive) type or an n (negative) type and a channel between the drain region and the source region.

A gate insulating layer 225 is disposed on the semiconductor layer 220 in the second sub-pixel SPn2. The gate insulating layer 225 may have a single layer including one of silicon oxide (SiOx) and silicon nitride (SiNx) or a multiple layer including at least one of silicon oxide (SiOx) and silicon nitride (SiNx). A gate electrode 230 is disposed on the gate insulating layer 225 over the channel of the semiconductor layer 220 in the second pixel SPn2. The gate electrode 230 may include one of molybdenum (Mo), aluminum (Al), chromium (Cr), gold (Au), titanium (Ti), nickel (Ni), neodymium (Nd) and copper (Cu) or an alloy thereof. The gate electrode 230 may have a multiple layer of one of molybdenum (Mo), aluminum (Al), chromium (Cr), gold (Au), titanium (Ti), nickel (Ni), neodymium (Nd) and copper (Cu) or an alloy thereof. For example, the gate electrode 230 may have a double layer of molybdenum/aluminum-neodymium (Mo/AlNd) or molybdenum/aluminum (Mo/Al).

An interlayer insulating layer 235 insulating the gate electrode 230 is disposed on the gate electrode 230 in the second sub-pixel SPn2. The interlayer insulating layer 235 may have a single layer including one of silicon oxide (SiOx) and silicon nitride (SiNx) or a multiple layer including at least one of silicon oxide (SiOx) and silicon nitride (SiNx). A drain electrode 240 and a source electrode 245 are disposed on the interlayer insulating layer 235 in the second sub-pixel SPn2. The drain electrode 240 and the source electrode 245 are connected to the semiconductor layer 210 through contact holes 237 in the gate insulating layer 225 and the interlayer insulating layer 235. The drain electrode 240 and the source electrode 245 may have a single layer or a multiple layer. When the drain electrode 240 and the source electrode 245 have a single layer, the drain electrode 240 and the source electrode 245 may include one of molybdenum (Mo), aluminum (Al), chromium (Cr), gold (Au), titanium (Ti), nickel (Ni), neodymium (Nd) and copper (Cu) or an alloy thereof. When the drain electrode 240 and the source electrode 245 have a multiple layer, the drain electrode 240 and the source electrode 245 may have a double layer of molybdenum/aluminum-neodymium (Mo/AlNd) or a triple layer of one of titanium/aluminum/titanium (Ti/Al/Ti), molybdenum/aluminum/molybdenum (Mo/Al/Mo) and molybdenum/aluminum-neodymium/molybdenum (Mo/AlNd/Mo). The semiconductor layer 220, the gate electrode 230, the drain electrode 240 and the source electrode 245 constitute the driving transistor DR.

A passivation layer 250 is disposed on the driving transistor DR over the substrate 200 in the second sub-pixel SPn2. The passivation layer 250 protects the elements thereunder. The passivation layer 250 may have a single layer including one of silicon oxide (SiOx) and silicon nitride (SiNx) or a multiple layer including at least one of silicon oxide (SiOx) and silicon nitride (SiNx). An overcoating layer 260 is disposed on the passivation layer 250 in the second sub-pixel SPn2. The overcoating layer 260 as a planarizing layer mitigates a step difference thereunder. The overcoating layer 260 may include an organic material such as polyimide (PI), benzocyclobutene (BCB) series resin and polyacrylate. The overcoating layer 260 and the passivation layer 250 have a via hole 265 exposing the source electrode 245 of the driving transistor DR.

The light emitting diode OLED is disposed on the overcoating layer 260 in the second sub-pixel SPn2. A first electrode 270 is disposed on the overcoating layer 260 having the via hole 265. The first electrode 270 functions as a pixel electrode and is connected to the source electrode 245 of the driving transistor DR through the via hole 265. The first electrode 270 as an anode may include a transparent conductive material such as indium-tin-oxide (ITO), indium-zinc-oxide (IZO) and zinc-oxide (ZnO). Since the first electrode 270 is a reflective electrode in the top emission type OLED display device, the first electrode 270 may further include a reflecting layer. The reflecting layer may include one of aluminum (Al), copper (Cu), silver (Ag) and nickel (Ni) or an alloy thereof. For example, the first electrode 270 may include an alloy of silver/palladium/copper (Ag/Pd/Cu: APC).

A bank layer 280 dividing the pixel is disposed on the first electrode 270 over the overcoating layer 260 in the second sub-pixel SPn2. The bank layer 280 may include an organic material such as polyimide (PI), benzocyclobutene (BCB) series resin and polyacrylate. The bank layer 280 has an open portion 285 exposing the first electrode 270.

An organic emitting layer 290 is disposed on the first electrode 270 and the bank layer 280 in the second sub-pixel SPn2. The organic emitting layer 290 may be disposed on a whole of the substrate 200 to contact the first electrode 270 through the open portion 285 of the bank layer 280. The organic emitting layer 290 may include an emitting material layer where an electron and a hole are combined with each other to emit a light. The organic emitting layer 290 may further include one of a hole injecting layer, a hole transporting layer, an electron transporting layer and an electron injecting layer. A second electrode 295 is disposed on the organic emitting layer 290 in the second sub-pixel SPn2.

The second electrode 295 as a cathode may be disposed on a whole of the substrate 200. Since the second electrode 295 is a transparent electrode in the top emission type OLED display device, the second electrode 295 may include one of magnesium (Mg), calcium (Ca), aluminum (Al) and silver (Ag) or an alloy thereof. The first electrode 270, the organic emitting layer 290 and the second electrode 295 constitute the light emitting diode OLED.

A counter substrate 310 is disposed to face into the substrate 200. The counter substrate 310 may include one of a glass, a plastic and a metal such that a light passes through the counter substrate 310. A color filter layer 315 is disposed on an inner surface (i.e., a surface facing into the substrate 200) of the counter substrate 310 in the second sub-pixel SPn2. The color filter layer 315 may convert a color of a light emitted from the organic emitting layer 290. For example, a white colored light emitted from the organic emitting layer 290 may be converted into one of a red colored light, a green colored light and a blue colored light through the color filter layer 315.

A black matrix 320 is disposed at periphery of the color filter layer 315 in the second sub-pixel SPn2. The black matrix 320 prevents a color mixing of sub-pixels and improves a contrast ratio. As shown in FIG. 4, the black matrix 320 may be disposed in a boundary portion of each of the first to fourth sub-pixels SPn1 to SPn4.

In the OLED display device according to the first embodiment of the present disclosure, the transparent region TA is disposed at both sides of the first to fourth sub-pixels SPn1 to SPn4.

In FIG. 5, the first buffer layer 205, the second buffer layer 215, the gate insulating layer 225, the interlayer insulating layer 235 and the passivation layer 250 are sequentially disposed on the substrate 200 in the transparent region TA. The overcoating layer 260, the bank layer 280, the first electrode 290 and the second electrode 295 in the second sub-pixel SPn2 are not disposed in the transparent region TA. The organic emitting layer 290 is disposed on the passivation layer 250 in the transparent region TA. The organic emitting layer 290 may extend from the second sub-pixel SPn2 to the transparent region TA. Since the organic emitting layer 290 rarely influences a transmittance of a light, the organic emitting layer 290 may be disposed in the transparent region TA.

A light controlling element LCS is disposed on the organic emitting layer 290 in the transparent region TA. The light controlling element LCS adjusts a light transmittance such that the light controlling element LCS transmits or blocks a light according to application of a voltage. In the OLED display device according to the first embodiment of the present disclosure, the light controlling element LCS exemplarily includes a polymer network liquid crystal (PNLC).

The light controlling element LCS includes a lower electrode 300, a lower alignment layer 370 on the lower electrode 300, an upper electrode 355 facing into the lower electrode 300, an upper alignment layer 375 on a surface of the upper electrode 355 facing the lower electrode 300 and a light controlling layer 380 between the lower alignment layer 370 and the upper alignment layer 375.

The lower electrode 300 is disposed on the organic emitting layer 290 over the substrate 200 in the transparent region TA. The lower electrode 300 may include the same material as the second electrode 295 of the light emitting diode OLED and may be a transparent electrode transmitting a light. The lower electrode 300 may be formed at the same time with the second electrode 295. For example, after a second electrode material layer is formed on the substrate 200, the second electrode 295 of the light emitting diode OLED and the lower electrode 300 are simultaneously formed by patterning the second electrode material layer. The lower alignment layer 370 is disposed on the lower electrode 300. The lower alignment layer 370 may be a vertical alignment layer aligning a liquid crystal vertically.

The upper electrode 355 is disposed on the inner surface (i.e., a surface facing into the substrate 200) of the counter substrate 310. The upper electrode 355 may be a transparent electrode transmitting a light and may include a transparent conductive material such as indium-tin-oxide (ITO), indium-zinc-oxide (IZO) and zinc-oxide (ZnO). The upper alignment layer 375 is disposed on a surface of the upper electrode 355 (i.e., a surface facing the lower alignment layer 370). Similarly to the lower alignment layer 370, the upper alignment layer 375 may be a vertical alignment layer aligning a liquid crystal vertically.

The light controlling layer 380 is disposed between the lower alignment layer 370 and the upper alignment layer 375. The light controlling layer 380 may include a polymer network liquid crystal (PNLC) having a liquid crystal 381, a coloring member 382 and a net member 383.

The liquid crystal 381 has a homeotropic phase where the liquid crystal 381 is aligned vertically with respect to the lower electrode 300 in an initial state. The liquid crystal 381 may have a negative type. In the initial state, a voltage is not applied to the lower electrode 300 and the upper electrode 355 and an electric field is not applied to the light controlling layer 380.

The coloring member 382 includes a polymer having a long axis and a short axis and an alignment of the coloring member 382 is changed according to an alignment of the liquid crystal 381. For example, the coloring member 382 of the initial state may be vertically aligned along the liquid crystal 381. As the long axis of the coloring member 382 is long and the short axis of the coloring member 382 is short, a higher transparency in a transparent mode driving and a higher opaqueness in a blocking mode driving are obtained.

The net member 383 is disposed in the light controlling layer 380 to have a polymer network shape. The net member 383 may include one of a photo curable monomer of a transparent material and a heat curable monomer of a transparent material. After a liquid crystal mixture is formed by mixing a photo curable monomer and the liquid crystal 381, a light is irradiated onto the liquid crystal mixture such that the photo curable monomer and the liquid crystal 381 are separated in phase and the monomer is changed to a polymer. As a result, the net member 383 having a network shape (a net shape) is formed in the light controlling layer 380. Since the net member 383 is formed in the light controlling layer 380 to have a net shape from an upper portion to a lower portion, the liquid crystal 381 is induced to be aligned vertically due to the net member 383. The net member 383 may maintain a cell gap of the light controlling layer 380.

The light controlling layer 380 of a polymer network liquid crystal (PNLC) of the initial state where a voltage is not applied operates in a transparent mode where a light is transmitted due to the upper and lower alignment layers 375 and 370. When a voltage is applied to the upper and lower electrodes 355 and 300, the liquid crystal 381 and the coloring member 382 are aligned randomly and the light controlling layer 380 operates in a blocking mode where a light is shielded.

The light controlling layer 380 is disposed in the second sub-pixel SPn2 as well as in the transparent region TA. Since the light controlling layer 380 is disposed between the second electrode 295 and the color filter layer 315 in the second sub-pixel SPn2, the electric field is not applied to the light controlling layer 380 in the second sub-pixel SPn2. Since the light controlling layer 380 of the initial state operates in a transparent mode where a light is transmitted, the light controlling layer 380 of the transparent mode does not reduce a transmittance of a light emitted from the light emitting diode OLED in the second sub-pixel SPn2.

In the OLED display device according to the first embodiment of the present disclosure, auxiliary electrodes may be disposed for preventing a voltage drop in the lower and upper electrodes 300 and 355, respectively.

First and second auxiliary electrodes 330 and 335 are disposed on the black matrix 320 of the counter substrate 310 in the second sub-pixel SPn2, respectively. The first and second auxiliary electrodes 330 and 335 are spaced apart from each other with the transparent region TA interposed therebetween and are disposed adjacent to each other. For example, the first and second auxiliary electrodes 330 and 335 may extend parallel to each other along the transparent region TA. The first auxiliary electrode 330 may be disposed on the black matrix 320 at a left side of the transparent region TA and the second auxiliary electrode 335 may be disposed on the black matrix 320 at a right side of the transparent region TA. The first and second auxiliary electrodes 330 and 335 may include a metal having a relatively low resistance such as one of molybdenum (Mo), aluminum (Al), chromium (Cr), gold (Au), titanium (Ti), nickel (Ni), neodymium (Nd) and copper (Cu) or an alloy thereof.

To connect the first auxiliary electrode 330 to the lower electrode 300, a sidewall 340 is disposed on the counter substrate 310, and a connecting electrode 350 connecting the first auxiliary electrode 330 and the lower electrode 300 is disposed on the sidewall 340. The sidewall 340 is disposed on the inner surface of the counter substrate 310 and protrudes adjacent to the lower electrode 300. As shown in FIG. 4, the sidewall 340 may be disposed to overlap the transparent region TA. Since the sidewall 340 includes a transparent organic material, the sidewall 340 does not reduce a transmittance of the transparent region TA. The sidewall 340 may have a dot type, and a plurality of sidewalls 340 may be disposed in the transparent region TA. The plurality of sidewalls 340 may have a sufficient number to prevent a voltage drop in the lower electrode 300.

The connecting electrode 350 extends from the first auxiliary electrode 330 to the lower electrode 300 along the sidewall 340. Since the connecting electrode 350 is disposed to overlap the transparent region TA along the sidewall 340, the connecting electrode 350 may include a transparent conductive material such as indium-tin-oxide (ITO), indium-zinc-oxide (IZO) and zinc-oxide (ZnO). A conductive adhesive 360 may be disposed between the connecting electrode 350 and the lower electrode 300 such that the connecting electrode 350 and the lower electrode 300 are electrically connected to each other.

The second auxiliary electrode 335 is disposed on the black matrix 320 at the right side of the transparent region TA. The upper electrode 355 extends on the second auxiliary electrode 335 to directly contact and electrically connected to the second auxiliary electrode 335. Since the first and second auxiliary electrodes 330 and 335 are disposed on the black matrix 320, reflection of an external light due to the first and second auxiliary electrodes 330 and 335 may be prevented.

In the OLED display device according to the first embodiment of the present disclosure, since the light emitting diode OLED and the light controlling element LCS are disposed between substrate 200 and the counter substrate 310, a bright room contrast ratio is improved without increase of a thickness of the display device.

In addition, since the light controlling element LCS is disposed in the transparent region TA, a bright room contrast ratio is improved with a loss in aperture ratio and transmittance of the transparent region TA minimized.

Further, since the auxiliary electrode is disposed for the electrodes of the light controlling element LCS, a voltage drop in the electrodes of the light controlling element LCS is minimized and deterioration in driving is minimized.

In another embodiment, a dynamic scattering liquid crystal may be used for the light controlling element LCS.

Figure 6:
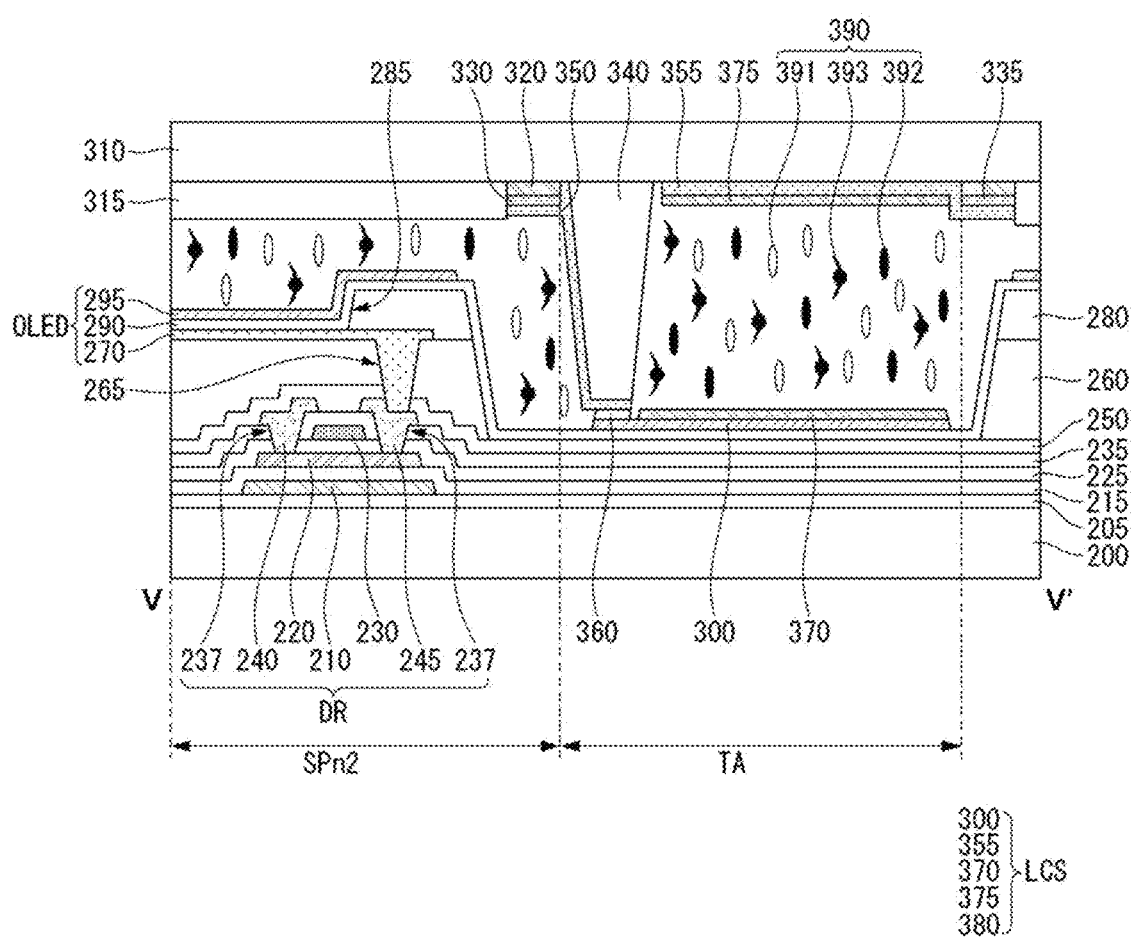
FIG. 6 is a cross-sectional view showing a sub-pixel and a transparent region of an organic light emitting diode display device according to a second embodiment of the present disclosure.

FIG. 6 is a cross-sectional view showing a sub-pixel and a transparent region of an organic light emitting diode display device according to a second embodiment of the present disclosure. FIG. 6 shows a cross-section taken along a line corresponding to a line V-V' of FIG. 4. A part having the same structure as that of FIG. 5 may be designated with the same reference number and illustration for the part will be omitted.

In FIG. 6, the OLED display device according to the second embodiment of the present disclosure includes a dynamic scattering liquid crystal (DSLC) as a light controlling layer 390 of a light controlling element LCS. The light controlling layer 390 may include a liquid crystal 391, a dichroic dye 392 and an ionic material 393.

The liquid crystal 391 may have a positive type and may be aligned vertically due to lower and upper alignment layers 300 and 375 without application of a voltage. Similarly to the liquid crystal 391, the dichroic dye 392 may be aligned vertically (long axis parallel to vertical direction) without application of a voltage. As a result, the light controlling element LCS operates in a transparent mode when a voltage is not applied.

The dichroic dye 392 may absorb a light. For example, the dichroic dye 392 may include a black dye absorbing all of a visible ray or a dye absorbing a light other than a wavelength band of a predetermined color (e.g., red) and reflecting a light of a wavelength band of the predetermined color (e.g., red). Although the dichroic dye 392 is a black dye in the second embodiment, the dichroic dye 392 is not limited thereto. For example, the dichroic dye 392 may be a dye having a color of one of red, green, blue and yellow or a color of a mixture thereof.

The ionic material 393 facilitates random movement of the liquid crystal 391 and the dichroic dye 392. The ionic material 393 may have a predetermined polarity and may move to the lower electrode 300 and the upper electrode 355 according to a polarity of a voltage applied to the lower electrode 300 and the upper electrode 355. For example, when the ionic material 393 has a negative polarity, a voltage of a positive polarity is applied to the lower electrode 300 and a voltage of a negative polarity is applied to the upper electrode 355 such that the ionic material 393 moves to the lower electrode 300. When the ionic material 393 has a negative polarity, a voltage of a positive polarity is applied to the upper electrode 355 and a voltage of a negative polarity is applied to the lower electrode 300 such that the ionic material 393 moves to the upper electrode 355. When the ionic material 393 has a positive polarity, a voltage of a positive polarity is applied to the upper electrode 355 and a voltage of a negative polarity is applied to the lower electrode 300 such that the ionic material 393 moves to the lower electrode 300. When the ionic material 393 has a positive polarity, a voltage of a positive polarity is applied to the lower electrode 300 and a voltage of a negative polarity is applied to the upper electrode 355 such that the ionic material 393 moves to the upper electrode 355. As a result, when a voltage is applied to the upper and lower electrodes 355 and 300, the ionic material 393 may repeat a movement such that the ionic material 393 moves from the upper electrode 355 to the lower electrode 300 and then returns to the upper electrode 355 with a predetermined period. Since the ionic material 393 collides with the liquid crystal 391 and the dichroic dye 392 while moving, the liquid crystal 393 and the dichroic dye 392 move randomly. Since a light incident to the light controlling layer 390 is scattered by the liquid crystal 391 moving randomly or is absorbed by the dichroic dye 392, a blocking mode is obtained.

The light controlling layer 390 is disposed in the second sub-pixel SPn2 as well as in the transparent region TA. Since the light controlling layer 390 is disposed between the second electrode 295 and the color filter layer 315 in the second sub-pixel SPn2, the electric field is not applied to the light controlling layer 390 in the second sub-pixel SPn2. Since the light controlling layer 390 of the initial state operates in a transparent mode where a light is transmitted, the light controlling layer 390 of the transparent mode does not reduce a transmittance of a light emitted from the light emitting diode OLED in the second sub-pixel SPn2.

In the OLED display device according to the second embodiment of the present disclosure, since the light emitting diode OLED and the light controlling element LCS are disposed between substrate 200 and the counter substrate 310, a bright room contrast ratio is improved without increase of a thickness of the display device.

In addition, since the light controlling element LCS is disposed in the transparent region TA, a bright room contrast ratio is improved with a loss in aperture ratio and transmittance of the transparent region TA minimized.

Further, since the auxiliary electrode is disposed for the electrodes of the light controlling element LCS, a voltage drop in the electrodes of the light controlling element LCS is minimized and deterioration in driving is minimized.

In another embodiment, a polymer dispersed liquid crystal (PDLC) or an electro chromic (EC) material may be used for the light controlling element LCS.

Figure 7:
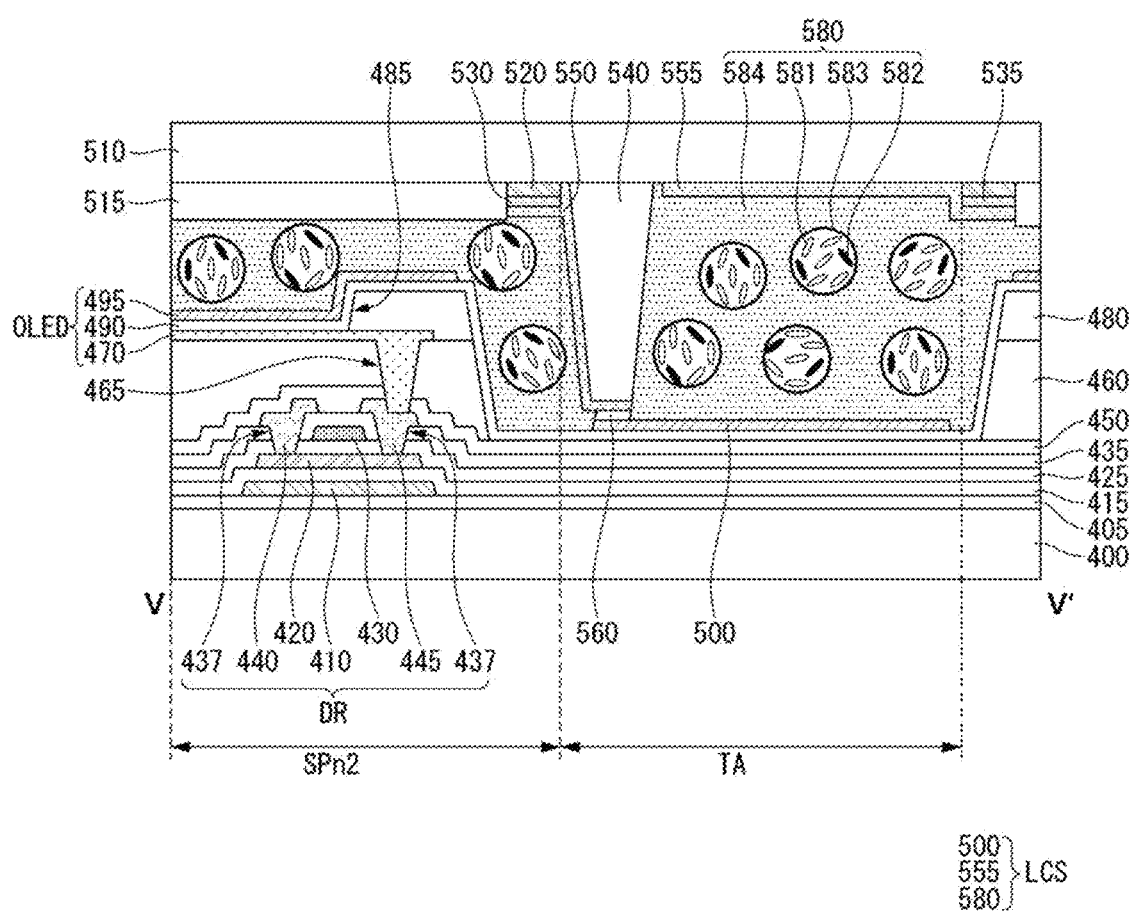
FIG. 7 is a cross-sectional view showing a sub-pixel and a transparent region of an organic light emitting diode display device according to a third embodiment of the present disclosure.
Figure 8:
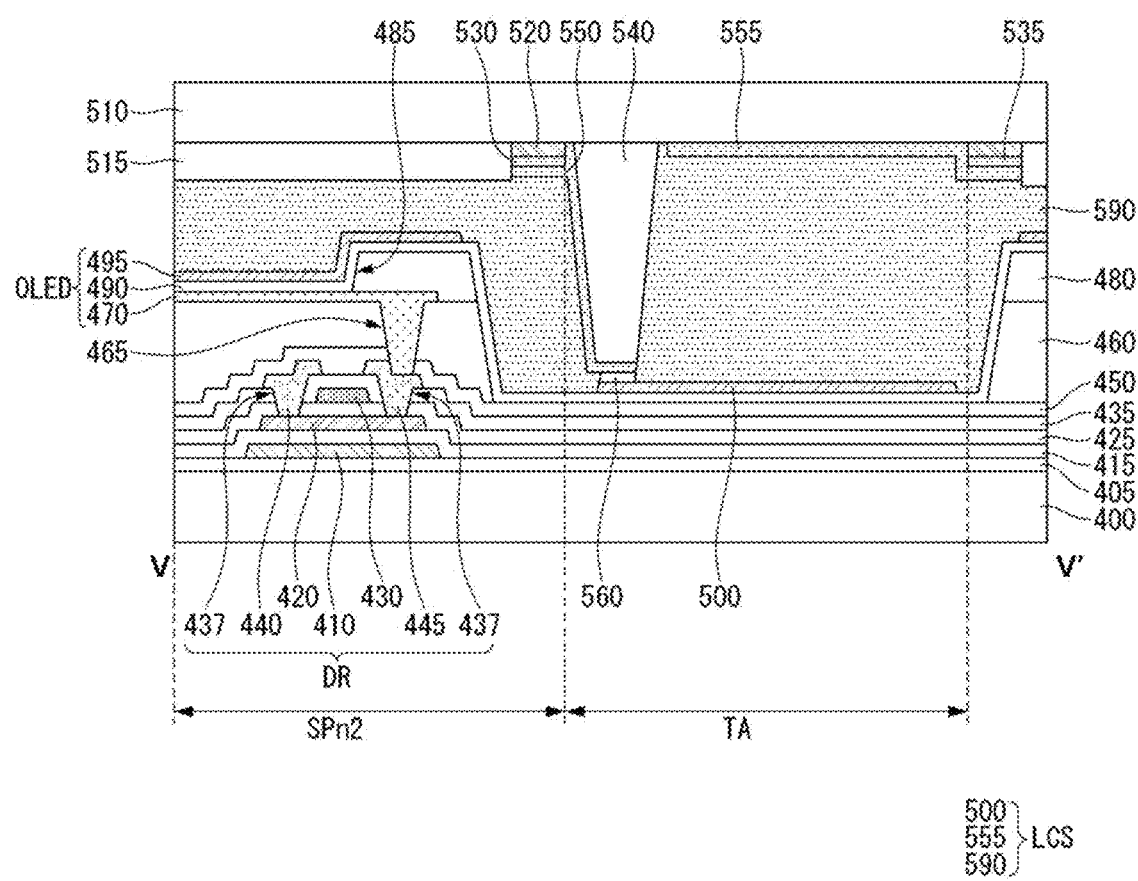
FIG. 8 is a cross-sectional view showing a sub-pixel and a transparent region of an organic light emitting diode display device according to a fourth embodiment of the present disclosure.

FIG. 7 is a cross-sectional view showing a sub-pixel and a transparent region of an organic light emitting diode display device according to a third embodiment of the present disclosure, and FIG. 8 is a cross-sectional view showing a sub-pixel and a transparent region of an organic light emitting diode display device according to a fourth embodiment of the present disclosure. FIGS. 7 and 8 show a cross-section taken along a line corresponding to a line V-V' of FIG. 4. A part having the same structure as that of FIG. 5 may be designated with the same reference number and illustration for the part will be omitted.

In FIG. 7, the OLED display device according to the third embodiment of the present disclosure includes a substrate 400. The substrate 400 includes the second sub-pixel SPn2 and the transparent region TA. After the second sub-pixel SPn2 is illustrated, the transparent region TA is illustrated.

A first buffer layer 405 is disposed on the substrate 400 in the second sub-pixel SPn2, and a light shielding layer 410 is disposed on the first buffer layer 405 in the second sub-pixel SPn2. A second buffer layer 415 is disposed on the light shielding layer 410 in the second sub-pixel SPn2, and the semiconductor layer 420 is disposed on the second buffer layer 415 in the second sub-pixel SPn2. A gate insulating layer 425 is disposed on the semiconductor layer 420 in the second sub-pixel SPn2, and a gate electrode 430 is disposed on the gate insulating layer 425 in the second sub-pixel SPn2. An interlayer insulating layer 435 is disposed on the gate electrode 430 in the second sub-pixel SPn2, and a drain electrode 440 and a source electrode 445 are disposed on the interlayer insulating layer 435 in the second sub-pixel SPn2. The drain electrode 440 and the source electrode 445 are connected to the semiconductor layer 410 through contact holes 437. The semiconductor layer 420, the gate electrode 430, the drain electrode 440 and the source electrode 445 constitute a driving transistor DR.

A passivation layer 450 is disposed on the driving transistor over the substrate 400 in the second sub-pixel SPn2, and an overcoating layer 460 is disposed on the passivation layer 450 in the second sub-pixel SPn2. The overcoating layer 460 and the passivation layer 450 have a via hole exposing the source electrode 445 of the driving transistor DR. A light emitting diode OLED is disposed on the overcoating layer 460 in the second sub-pixel SPn2.

A first electrode 470 is disposed on the overcoating layer 460 having the via hole 465. The first electrode 470 is connected to the source electrode 445 of the driving transistor DR through the via hole 465. A bank layer 480 having an open portion 485 exposing the first electrode 470 is disposed on the first electrode 470 over the overcoating layer 460 in the second sub-pixel SPn2. An organic emitting layer 490 is disposed on the first electrode 470 and the bank layer 480 in the second sub-pixel SPn2, and a second electrode 495 is disposed on the organic emitting layer 490 in the second sub-pixel SPn2. The first electrode 470, the organic emitting layer 490 and the second electrode 495 constitute the light emitting diode OLED. A counter substrate 510 is disposed to face into the substrate 400, and a color filter layer 515 is disposed on an inner surface (i.e., a surface facing into the substrate 400) of the counter substrate 510 in the second sub-pixel SPn2. A black matrix 520 is disposed at periphery of the color filter layer 515 in the second sub-pixel SPn2.

The first buffer layer 405, the second buffer layer 415, the gate insulating layer 425, the interlayer insulating layer 435 and the passivation layer 450 are sequentially disposed on the substrate 400 in the transparent region TA. The overcoating layer 460, the bank layer 480, the first electrode 490 and the second electrode 495 in the second sub-pixel SPn2 are not disposed in the transparent region TA. The organic emitting layer 490 is disposed on the passivation layer 450 in the transparent region TA.

A light controlling element LCS is disposed on the organic emitting layer 490 in the transparent region TA. In the third embodiment, the light controlling element LCS including a polymer dispersed liquid crystal (PDLC) will be exemplarily illustrated.

The light controlling element LCS includes a lower electrode 500, an upper electrode 555 facing into the lower electrode 500 and a light controlling layer 580 between the lower electrode 500 and the upper electrode 555. Differently from the first embodiment, a lower alignment layer and an upper alignment layer are not disposed in the third embodiment. The light controlling layer 580 of a polymer dispersed liquid crystal (PDLC) includes a droplet 583 having a liquid crystal 581 and a coloring member 582 and a polymer 584.

The liquid crystal 581 has a homeotropic phase where the liquid crystal 581 is aligned vertically with respect to the lower electrode 500 in an initial state. The liquid crystal 581 may have a negative type. The coloring member 582 includes a polymer having a long axis and a short axis and an alignment of the coloring member 582 is changed according to an alignment of the liquid crystal 581. For example, the coloring member 582 of the initial state may be vertically aligned along the liquid crystal 581. The light controlling layer 580 except the droplet 583 has a solid state due to the polymer 584. As a result, a cell gap of the light controlling layer 580 may be maintained without a spacer.

The liquid crystal 581 of the light controlling layer 580 has a long axis and a short axis. A refractive index of the short axis of the liquid crystal 581 is the same as a refractive index of the polymer 584 and a refractive index of the long axis of the liquid crystal 581 is different from a refractive index of the polymer 584. For example, the refractive index of the long axis may be greater than the refractive index of the short axis in a negative type liquid crystal. Accordingly, the refractive index of the long axis of the liquid crystal 581 may be greater than the refractive index of the short axis of the liquid crystal 581. The polymer 584 may include a material having a refractive index the same as the refractive index of the short axis of the liquid crystal 581.

The light controlling layer 580 may be formed by mixing the liquid crystal 581, the coloring member 582 and a monomer changed to a polymer by a light such as ultraviolet (UV) ray. After a liquid crystal mixture is formed by mixing a photo curable monomer and the liquid crystal 581, a light is irradiated onto the liquid crystal mixture such that the photo curable monomer is changed to the polymer 584 of a solid state. As a result, the droplet 583 having the liquid crystal 581 and the coloring member 582 is disposed in the polymer 584.

The light controlling layer 580 of a polymer dispersed liquid crystal (PDLC) of the initial state where a voltage is not applied operates in a transparent mode where a light is transmitted. When a voltage is applied to the upper and lower electrodes 555 and 500, the liquid crystal 581 and the coloring member 582 are aligned randomly and the light controlling layer 580 operates in a blocking mode where a light is shielded.

The light controlling layer 580 is disposed in the second sub-pixel SPn2 as well as in the transparent region TA. Since the light controlling layer 580 is disposed between the second electrode 495 and the color filter layer 515 in the second sub-pixel SPn2, the electric field is not applied to the light controlling layer 580 in the second sub-pixel SPn2. Since the light controlling layer 580 of the initial state operates in a transparent mode where a light is transmitted, the light controlling layer 580 of the transparent mode does not reduce a transmittance of a light emitted from the light emitting diode OLED in the second sub-pixel SPn2.

Similarly to the first embodiment, auxiliary electrodes may be disposed for preventing a voltage drop in the lower and upper electrodes 500 and 555, respectively. In the OLED display device according to the third embodiment of the present disclosure.

First and second auxiliary electrodes 530 and 535 are disposed on the black matrix 520 of the counter substrate 510 in the second sub-pixel SPn2, respectively. The first and second auxiliary electrodes 530 and 535 are spaced apart from each other with the transparent region TA interposed therebetween and are disposed adjacent to each other. For example, the first and second auxiliary electrodes 530 and 535 may extend parallel to each other along the transparent region TA. The first auxiliary electrode 530 may be disposed on the black matrix 520 at a left side of the transparent region TA and the second auxiliary electrode 535 may be disposed on the black matrix 520 at a right side of the transparent region TA.

To connect the first auxiliary electrode 530 to the lower electrode 500, a sidewall 540 is disposed on the counter substrate 510, and a connecting electrode 550 connecting the first auxiliary electrode 530 and the lower electrode 500 is disposed on the sidewall 540. As shown in FIG. 4, the sidewall 540 may be disposed to overlap the transparent region TA. Since the sidewall 540 includes a transparent organic material, the sidewall 540 does not reduce a transmittance of the transparent region TA. A plurality of sidewalls 540 may be disposed in the transparent region TA, and the plurality of sidewalls 540 may have a sufficient number to prevent a voltage drop in the lower electrode 500.

The connecting electrode 550 extends from the first auxiliary electrode 530 to the lower electrode 500 along the sidewall 540. Since the connecting electrode 550 is disposed to overlap the transparent region TA along the sidewall 540, the connecting electrode 550 may include a transparent conductive material. A conductive adhesive 560 may be disposed between the connecting electrode 550 and the lower electrode 500 such that the connecting electrode 550 and the lower electrode 500 are electrically connected to each other.

The second auxiliary electrode 535 is disposed on the black matrix 520 at the right side of the transparent region TA. The upper electrode 555 extends on the second auxiliary electrode 535 to directly contact and electrically connected to the second auxiliary electrode 535. Since the first and second auxiliary electrodes 530 and 535 are disposed on the black matrix 520, reflection of an external light due to the first and second auxiliary electrodes 530 and 535 may be prevented.

In the OLED display device according to the third embodiment of the present disclosure, since the light emitting diode OLED and the light controlling element LCS are disposed between substrate 400 and the counter substrate 510, a bright room contrast ratio is improved without increase of a thickness of the display device.

In addition, since the light controlling element LCS is disposed in the transparent region TA, a bright room contrast ratio is improved with a loss in aperture ratio and transmittance of the transparent region TA minimized.

Further, since the auxiliary electrode is disposed for the electrodes of the light controlling element LCS, a voltage drop in the electrodes of the light controlling element LCS is minimized and deterioration in driving is minimized.

In FIG. 8, the OLED display device according to the fourth embodiment of the present disclosure includes an electro chromic (EC) material for a light controlling layer 590 of a light controlling element LCS. The light controlling layer 590 may be disposed between a lower electrode 500 and an upper electrode 555 and may include an EC material.

When a voltage is applied to the lower electrode 500 and the upper electrode 555, the electro chromic material displays a black and the light controlling layer 590 operates in a blocking mode where a light is shielded. When a voltage is not applied to the lower electrode 500 and the upper electrode 555, the electro chromic material is changed transparent and the light controlling layer 590 operates in a transparent mode where a light is transmitted.

A color of the electro chromic material is changed by an electric field. For example, the electro chromic material may include an inorganic material such as tungsten oxide ($WO_3$), nickel hydroxide (NiOxHy), niobium oxide ($Nb_2O_5$), titanium oxide ($TiO_2$) and molybdenum oxide ($MoO_3$) or an organic material such as thiophene, carbazole, phenylene vinylene, acetylene, aniline, phenylene diamine, polymer including repeating unit derived from pyrrole monomer, viologens derivatives, phenothiazine and tetrathio ful balenium. Since the electro chromic material corresponds to blocking of black and transmission of transparency, the electro chromic material may change from a transparent state to a black state or from a black state to a transparent state. When it is hard to obtain the black with a single color, the black may be obtained with a combination of cyan, yellow and magenta or a combination of red, green and blue.

The electro chromic material may be dispersed in a transparent liquid electrolyte or may be used as a film with a transparent solid electrolyte. The liquid electrolyte may include lithium hydroxide (LiOH) solution of 1 M, lithium perchlorate (LiClO$_4$) solution of 1 M and potassium hydroxide (KOH) solution of 1 M. The solid electrolyte may include poly AMPS (2-acrylamido-2-methyl-1-propanesulfonic acid), poly VAP (vinylphosphonic acid) and modified PEO/LiCF$_3$SO$_3$ (polyethylene oxide/lithium trifluoromethanesulfonate). Specifically, since the solid electrolyte transmits an ion in a solid state, a problem such as a leakage of a liquid is prevented. Accordingly, the solid electrolyte is eco-friendly. Since the solid electrolyte is formed as a thin film, the solid electrolyte may be formed as all shapes. An electro chromic dispersion where the electro chromic material is formed by mixing the electro chromic material and the electrolyte.

In the OLED display device according to the fourth embodiment of the present disclosure, since the light emitting diode OLED and the light controlling element LCS are disposed between substrate 400 and the counter substrate 510, a bright room contrast ratio is improved without increase of a thickness of the display device.

In addition, since the light controlling element LCS is disposed in the transparent region TA, a bright room contrast ratio is improved with a loss in aperture ratio and transmittance of the transparent region TA minimized.

Further, since the auxiliary electrode is disposed for the electrodes of the light controlling element LCS, a voltage drop in the electrodes of the light controlling element LCS is minimized and deterioration in driving is minimized.

Figure 9:
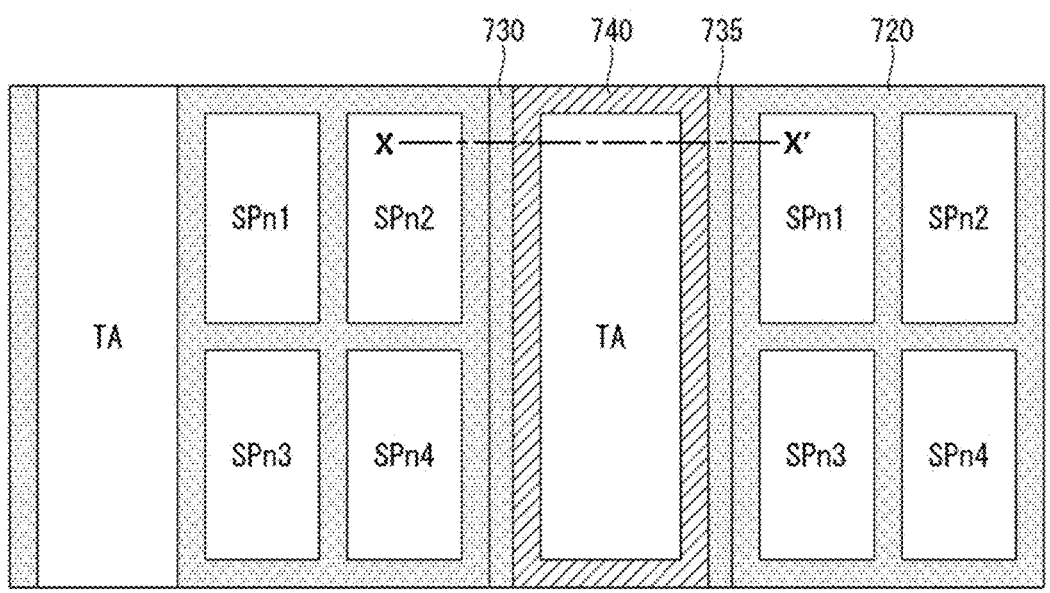
FIG. 9 is a plan view showing a sub-pixel and a transparent region of an organic light emitting diode display device according to a fifth embodiment of the present disclosure.
Figure 10:
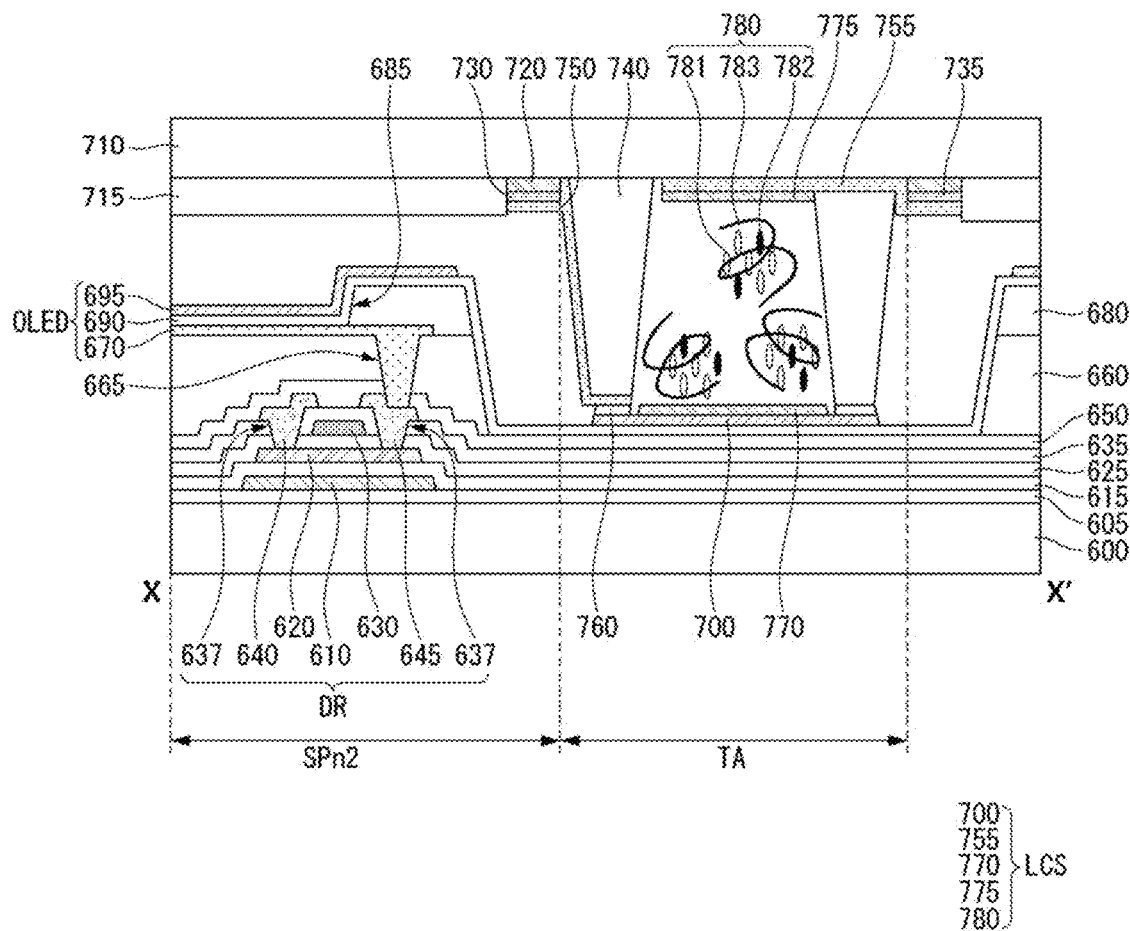
FIG. 10 is a cross-sectional view taken along a line X-X' of FIG. 9.

FIG. 9 is a plan view showing a sub-pixel and a transparent region of an organic light emitting diode display device according to a fifth embodiment of the present disclosure, and FIG. 10 is a cross-sectional view taken along a line X-X' of FIG. 9.

In FIG. 9, the OLED display device according to the fifth embodiment of the present disclosure includes first to fourth sub-pixels SPn1 to SPn4 emitting a light and a transparent region TA through which an external light passes. Differently from the first to fourth embodiment including a sidewall of a dot shape, a sidewall has a closed loop shape in the fifth embodiment. Since a structure of a sidewall of the fifth embodiment is different from a structure of a sidewall of the first to fourth embodiments, illustration for a part having the same structure as that of the first to fourth embodiments may be abbreviated in the fifth embodiment. In addition, a polymer network liquid crystal (PNLC) may be exemplarily used for a light controlling layer in the fifth embodiment. However, a dynamic scattering liquid crystal (DSLC), a polymer dispersed liquid crystal (PDLC) or an electro chromic material may be used for a light controlling layer in another embodiment.

In FIG. 10, the OLED display device according to the fifth embodiment of the present disclosure includes a substrate 600. The substrate 600 includes the second sub-pixel SPn2 and the transparent region TA. After the second sub-pixel SPn2 is illustrated, the transparent region TA is illustrated.

A first buffer layer 605 is disposed on the substrate 600 in the second sub-pixel SPn2, and a light shielding layer 610 is disposed on the first buffer layer 605 in the second sub-pixel SPn2. A second buffer layer 615 is disposed on the light shielding layer 610 in the second sub-pixel SPn2, and a semiconductor layer 620 is disposed on the second buffer layer 615 in the second sub-pixel SPn2. A gate insulating layer 625 is disposed on the semiconductor layer 620 in the second sub-pixel SPn2, and a gate electrode 630 is disposed on the gate insulating layer 625 over the semiconductor layer 620 in the second pixel SPn2. An interlayer insulating layer 635 insulating is disposed on the gate electrode 630 in the second sub-pixel SPn2, and a drain electrode 640 and a source electrode 645 are disposed on the interlayer insulating layer 635 in the second sub-pixel SPn2. The drain electrode 640 and the source electrode 645 are connected to the semiconductor layer 610 through contact holes 637 in the gate insulating layer 625 and the interlayer insulating layer 635. The semiconductor layer 620, the gate electrode 630, the drain electrode 640 and the source electrode 645 constitute a driving transistor DR.

A passivation layer 650 is disposed on the driving transistor DR over the substrate 600 in the second sub-pixel SPn2, and an overcoating layer 660 is disposed on the passivation layer 650 in the second sub-pixel SPn2. The overcoating layer 660 and the passivation layer 650 have a via hole 665 exposing the source electrode 645 of the driving transistor DR. A light emitting diode OLED is disposed on the overcoating layer 660 in the second sub-pixel SPn2.

A first electrode 670 is disposed on the overcoating layer 660 having the via hole 665. The first electrode 670 is connected to the source electrode 645 of the driving transistor DR through the via hole 665. A bank layer 680 having an open portion 685 exposing the first electrode 670 is disposed on the first electrode 670 over the overcoating layer 660 in the second sub-pixel SPn2. An organic emitting layer 690 is disposed on the first electrode 670 and the bank layer 680 in the second sub-pixel SPn2, and a second electrode 695 is disposed on the organic emitting layer 690 in the second sub-pixel SPn2. The first electrode 670, the organic emitting layer 690 and the second electrode 695 constitute a light emitting diode OLED. A counter substrate 710 is disposed to face into the substrate 600, and a color filter layer 715 is disposed on an inner surface (i.e., a surface facing into the substrate 600) of the counter substrate 710 in the second sub-pixel SPn2. A black matrix 720 is disposed at periphery of the color filter layer 715 in the second sub-pixel SPn2.

The first buffer layer 605, the second buffer layer 615, the gate insulating layer 625, the interlayer insulating layer 635 and the passivation layer 650 are sequentially disposed on the substrate 600 in the transparent region TA. The overcoating layer 660, the bank layer 680, the first electrode 690 and the second electrode 695 in the second sub-pixel SPn2 are not disposed in the transparent region TA. The organic emitting layer 690 is disposed on the passivation layer 650 in the transparent region TA.

A light controlling element LCS is disposed on the organic emitting layer 690 in the transparent region TA. In the OLED display device according to the fifth embodiment of the present disclosure, the light controlling element LCS exemplarily includes a polymer network liquid crystal (PNLC).

The light controlling element LCS includes a lower electrode 700, a lower alignment layer 770 on the lower electrode 700, an upper electrode 755 facing into the lower electrode 700, an upper alignment layer 775 on a surface of the upper electrode 755 facing the lower electrode 700 and a light controlling layer 780 between the lower alignment layer 770 and the upper alignment layer 775. The light controlling layer 780 may include a polymer network liquid crystal (PNLC) having a liquid crystal 781, a coloring member 782 and a net member 783.

The light controlling layer 780 of a polymer network liquid crystal (PNLC) of the initial state where a voltage is not applied operates in a transparent mode where a light is transmitted due to the upper and lower alignment layers 775 and 770. When a voltage is applied to the upper and lower electrodes 755 and 700, the liquid crystal 781 and the coloring member 782 are aligned randomly and the light controlling layer 780 operates in a blocking mode where a light is shielded.

In the OLED display device according to the fifth embodiment of the present disclosure, auxiliary electrodes may be disposed for preventing a voltage drop in the lower and upper electrodes 700 and 755, respectively. First and second auxiliary electrodes 730 and 735 are disposed on the black matrix 720 of the counter substrate 710 in the second sub-pixel SPn2, respectively. The first and second auxiliary electrodes 730 and 735 are spaced apart from each other with the transparent region TA interposed therebetween and are disposed adjacent to each other.

To connect the first auxiliary electrode 730 to the lower electrode 700, a sidewall 740 is disposed on the counter substrate 710, and a connecting electrode 750 connecting the first auxiliary electrode 730 and the lower electrode 700 is disposed on the sidewall 740. The sidewall 740 is disposed on the inner surface of the counter substrate 710 and protrudes adjacent to the lower electrode 700. As shown in FIG. 9, the sidewall 340 may be disposed to overlap the transparent region TA. Since the sidewall 740 includes a transparent organic material, the sidewall 740 does not reduce a transmittance of the transparent region TA.

In the OLED display device according to the fifth embodiment of the present disclosure, the sidewall 740 has a closed loop shape in the transparent region TA and the light controlling layer 780 is confined in the sidewall 740 of the transparent region. Since the light controlling layer 780 is not disposed in the second sub-pixel SPn2 and is disposed in the transparent region TA, a light emitted from the second sub-pixel SPn2 may not be influenced by the light controlling layer 780.

A plurality of sidewalls 740 each having a closed loop shape may be disposed in the transparent region TA. For example, as shown in FIG. 9, one side of a single sidewall 740 may correspond to a sum of the second and fourth sub-pixels SPn2 and SPn4, and a plurality of sidewalls 740 may be disposed in a whole of the OLED display device. However, the sidewall 740 is not limited thereto, and one side of a single sidewall may correspond to a sum of sub-pixels over two in another embodiment.

The connecting electrode 750 extends from the first auxiliary electrode 730 to the lower electrode 700 along the sidewall 740. A conductive adhesive 760 may be disposed between the connecting electrode 750 and the lower electrode 700 such that the connecting electrode 750 and the lower electrode 700 are electrically connected to each other.

The second auxiliary electrode 735 is disposed on the black matrix 720 at the right side of the transparent region TA. The upper electrode 755 extends on the second auxiliary electrode 735 to directly contact and electrically connected to the second auxiliary electrode 735. Specifically, since the sidewall 740 has a closed loop shape, a part of the sidewall 740 overlapping the upper electrode 755 may be disposed on the upper electrode 755 facing the lower electrode 700. In addition, a part of the sidewall 740 overlapping the upper electrode 755 may be attached to a top surface of the lower electrode 700 through the conductive adhesive 760 such that the light controlling layer 780 is confined in the sidewall 740.

In the OLED display device according to the fifth embodiment of the present disclosure, since the light emitting diode OLED and the light controlling element LCS are disposed between substrate 600 and the counter substrate 710, a bright room contrast ratio is improved without increase of a thickness of the display device.

In addition, since the light controlling element LCS is disposed in the transparent region TA, a bright room contrast ratio is improved with a loss in aperture ratio and transmittance of the transparent region TA minimized.

Further, since the auxiliary electrode is disposed for the electrodes of the light controlling element LCS, a voltage drop in the electrodes of the light controlling element LCS is minimized and deterioration in driving is minimized.

Moreover, since the light controlling layer 780 of the light controlling element LCS is confined in the sidewall 740 of a closed loop shape, an optical property of the light emitting diode OLED is not influenced by the light controlling layer 780.

It will be apparent to those skilled in the art that various modifications and variation can be made in the present disclosure without departing from the spirit or scope of the disclosure. Thus, it is intended that the present disclosure cover the modifications and variations of the present disclosure provided they come within the scope of the appended claims and their equivalents.

What is claimed is:

1. An organic light emitting diode display device, comprising:
    a substrate having at least one sub-pixel and a transparent region;
    a counter substrate facing into the substrate; and
    a light emitting diode and a light controlling element between the substrate and the counter substrate, the light controlling element including a lower electrode, an upper electrode, and a light controlling layer between the upper and lower electrodes, and the light controlling element being configured to control a light transmittance through the light controlling element to controllably operate in a transparent mode where light is transmitted through the light controlling element or in a blocking mode in which light is shielded by the light controlling element,
    wherein the light emitting diode overlaps the at least one sub-pixel,
    wherein the light controlling element overlaps the transparent region,
    wherein at least one of the upper electrode, the lower electrode, and the light controlling layer of the light controlling element is absent over the light emitting diode in a plan view normal to the substrate, and
    wherein the transparent region is disposed at one side of the at least one sub-pixel in a plan view.

2. The device of claim 1, wherein the light emitting diode is spaced apart from the transparent region, and
    wherein, in the transparent mode, an external light is passed from a rear of the substrate to a front of the counter substrate.

3. The device of claim 2, further comprising at least one thin film transistor overlapping the at least one sub-pixel and connected to the light emitting diode.

4. The device of claim 3, further comprising a color filter layer and a black matrix on an inner surface of the counter substrate overlapping the at least one sub-pixel.

5. The device of claim 4, wherein the lower electrode is on an inner surface of the substrate,
wherein the upper electrode is on the inner surface of the counter substrate, and
wherein the lower electrode and the upper electrode are absent over the light emitting diode in the plan view normal to the substrate.

6. The device of claim 5, further comprising first and second auxiliary electrodes spaced apart from each other and on the inner surface of the counter substrate.

7. The device of claim 6, wherein the first auxiliary electrode is connected to the lower electrode and the second auxiliary electrode is connected to the upper electrode.

8. The device of claim 7, further comprising a sidewall protruding toward the lower electrode and on the inner surface of the counter substrate.

9. The device of claim 8, further comprising a connecting electrode connecting the first auxiliary electrode and the lower electrode along the sidewall.

10. The device of claim 9, wherein the first and second auxiliary electrodes are spaced apart from each other with the transparent region interposed therebetween and extend parallel to each other along the transparent region.

11. The device of claim 10, wherein the sidewall overlaps the transparent region.

12. The device of claim 11, wherein the first and second auxiliary electrodes are disposed on the black matrix.

13. The device of claim 12, wherein the light controlling layer includes one of an electro chromic material and a polymer dispersed liquid crystal.

14. The device of claim 12, wherein the light controlling layer further comprises:
a lower alignment layer on the lower electrode; and
an upper alignment layer on the upper electrode.

15. The device of claim 14, wherein the light controlling layer includes one of a polymer network liquid crystal and a dynamic scattering liquid crystal.

16. The device of claim 8, wherein the sidewall has one of a dot shape and a closed loop shape.

17. The device of claim 12, further comprising a conductive adhesive between the sidewall and the lower electrode.

18. The device of claim 1, wherein the at least one sub-pixel includes first to fourth sub-pixels disposed in a matrix of two rows and two columns, and
wherein the transparent region is disposed at a left side of the first and third sub-pixels and at a right side of the second and fourth sub-pixels.

19. The device of claim 1, further comprising first and second auxiliary electrodes on an inner surface of the counter substrate,
wherein the first and second auxiliary electrodes are disposed along two opposite sides, respectively, of the transparent region.

* * * * *